(12) United States Patent
Sirinorakul et al.

(10) Patent No.: US 8,125,077 B2
(45) Date of Patent: Feb. 28, 2012

(54) PACKAGE WITH HEAT TRANSFER

(75) Inventors: Saravuth Sirinorakul, Bangkok (TH);
Somchai Nondhasitthichai, Bangkok (TH)

(73) Assignee: Utac Thai Limited, Bangkok (TH)

( * ) Notice: Subject to any disclaimer, the term of this patent is extended or adjusted under 35 U.S.C. 154(b) by 0 days.

(21) Appl. No.: 12/868,560

(22) Filed: Aug. 25, 2010

(65) Prior Publication Data

US 2010/0327432 A1 Dec. 30, 2010

Related U.S. Application Data (63) Continuation-in-part of application No. 11/899,189, filed on Sep. 4, 2007, now Pat. No. 8,013,437.

(60) Provisional application No. 60/847,434, filed on Sep. 26, 2006, provisional application No. 61/349,056, filed on May 27, 2010.

(51) Int. Cl.
*H01L 23/10* (2006.01)
*H01L 23/34* (2006.01)

(52) U.S. Cl. ................ 257/707; 257/E23.101

(58) Field of Classification Search .......... 257/707, 257/E23.101
See application file for complete search history.

(56) References Cited

U.S. PATENT DOCUMENTS

| | | | |
|---|---|---|---|
| 3,611,061 A | 10/1971 | Segerson | 317/234 R |
| 4,411,719 A | 10/1983 | Lindberg | 156/64 |
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,247,248 A | 9/1993 | Fukunaga | 324/158 |
| 5,248,075 A | 9/1993 | Young et al. | 228/5.1 |
| 5,396,185 A | 3/1995 | Honma et al. | 324/754 |
| 5,397,921 A | 3/1995 | Karnezos | 257/779 |
| 5,479,105 A | 12/1995 | Kim et al. | 324/755 |
| 5,535,101 A | 7/1996 | Miles et al. | |
| 5,596,231 A | 1/1997 | Combs | 257/776 |
| 5,843,808 A | 12/1998 | Karnezos | 438/121 |
| 5,990,692 A | 11/1999 | Jeong et al. | 324/755 |
| 6,072,239 A | 6/2000 | Yoneda et al. | 257/730 |
| 6,111,324 A | 8/2000 | Sheppard et al. | 257/787 |
| 6,159,770 A | 12/2000 | Tetaka et al. | 438/112 |
| 6,229,200 B1 | 5/2001 | Mclellan et al. | 257/666 |
| 6,242,281 B1 | 6/2001 | Mclellan et al. | 438/106 |
| 6,284,569 B1 | 9/2001 | Sheppard et al. | 438/110 |
| 6,285,075 B1 | 9/2001 | Combs et al. | 257/675 |
| 6,294,100 B1 | 9/2001 | Fan et al. | 216/14 |
| 6,304,000 B1 | 10/2001 | Isshiki et al. | 257/782 |
| 6,326,678 B1 | 12/2001 | Karnezos et al. | 257/666 |
| 6,329,711 B1 | 12/2001 | Kawahara et al. | 257/698 |

(Continued)

OTHER PUBLICATIONS

Office Action dated Oct. 26, 2010, U.S. Appl. No. 11/899,189, filed Sep. 4, 2007, Saravuth Sirinorakul et al.

(Continued)

*Primary Examiner* — Jenny L Wagner
(74) *Attorney, Agent, or Firm* — Haverstock & Owens LLP (57) ABSTRACT

A semiconductor package includes an encapsulant, a semiconductor device within the encapsulant, and one or more terminals for electrically coupling the semiconductor device to a node exterior to the package. The package further includes bonding means coupling the semiconductor device to the one or more terminals. The semiconductor package is configured to dissipate heat through a top surface of the package. To directly dissipate heat via the top surface of the package, a thermally conductive layer is coupled to the semiconductor device, and the layer is exposed at a surface of the package.

21 Claims, 9 Drawing Sheets

U.S. PATENT DOCUMENTS

| | | | |
|---|---|---|---|
| 6,353,263 B1 | 3/2002 | Dotta et al. | 257/777 |
| 6,376,921 B1 | 4/2002 | Yoneda et al. | 257/787 |
| 6,392,427 B1 | 5/2002 | Yang | 324/755 |
| 6,414,385 B1 * | 7/2002 | Huang et al. | 257/690 |
| 6,429,048 B1 | 8/2002 | McLellan et al. | 438/108 |
| 6,451,709 B1 * | 9/2002 | Hembree | 438/759 |
| 6,455,348 B1 | 9/2002 | Yamaguchi | 438/106 |
| 6,489,218 B1 | 12/2002 | Kim et al. | 438/460 |
| 6,498,099 B1 | 12/2002 | McLellan et al. | 438/689 |
| 6,507,116 B1 | 1/2003 | Caletka et al. | 257/778 |
| 6,545,332 B2 | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,667,191 B1 | 12/2003 | McLellan et al. | 438/121 |
| 6,686,667 B2 | 2/2004 | Chen et al. | 257/787 |
| 6,703,696 B2 | 3/2004 | Ikenaga et al. | 257/678 |
| 6,724,071 B2 | 4/2004 | Combs | 257/666 |
| 6,734,044 B1 | 5/2004 | Fan et al. | 438/123 |
| 6,734,552 B2 * | 5/2004 | Combs et al. | 257/707 |
| 6,737,755 B1 | 5/2004 | McLellan et al. | 257/796 |
| 6,764,880 B2 * | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 | 11/2004 | Islam et al. | 257/666 |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/667 |
| 6,897,428 B2 | 5/2005 | Minamio et al. | 250/208.1 |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,049,177 B1 | 5/2006 | Fan et al. | 438/123 |
| 7,060,535 B1 | 6/2006 | Sirinorakul et al. | 438/123 |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,274,088 B2 | 9/2007 | Wu et al. | 257/673 |
| 7,314,820 B2 | 1/2008 | Lin et al. | 438/617 |
| 7,315,080 B1 | 1/2008 | Fan et al. | 257/717 |
| 7,342,305 B1 | 3/2008 | Diao et al. | 257/706 |
| 7,344,920 B1 | 3/2008 | Kirloskar et al. | 438/123 |
| 7,348,663 B1 | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 | 7/2008 | Shim et al. | 438/106 |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,482,690 B1 | 1/2009 | Fan et al. | 257/724 |
| 7,595,225 B1 | 9/2009 | Fan et al. | 438/112 |
| 7,714,418 B2 | 5/2010 | Lim et al. | 257/670 |
| 2002/0109214 A1 | 8/2002 | Minamio et al. | |
| 2003/0006055 A1 | 1/2003 | Chien-Hung et al. | |
| 2003/0045032 A1 | 3/2003 | Abe | 438/123 |
| 2003/0071333 A1 | 4/2003 | Matsuzawa | 257/676 |
| 2003/0143776 A1 | 7/2003 | Pedron, Jr. et al. | 438/123 |
| 2003/0178719 A1 | 9/2003 | Combs et al. | 257/704 |
| 2003/0201520 A1 | 10/2003 | Knapp et al. | 257/666 |
| 2003/0207498 A1 | 11/2003 | Islam et al. | 438/120 |
| 2004/0014257 A1 | 1/2004 | Kim et al. | 438/111 |
| 2004/0046237 A1 | 3/2004 | Abe et al. | 257/676 |
| 2004/0070055 A1 | 4/2004 | Punzalan et al. | |
| 2004/0080025 A1 | 4/2004 | Kasahara et al. | 257/666 |
| 2004/0110319 A1 | 6/2004 | Fukutomi et al. | 438/106 |
| 2005/0003586 A1 | 1/2005 | Shimanuki et al. | 438/124 |
| 2005/0077613 A1 | 4/2005 | McLellan et al. | 257/706 |
| 2005/0236701 A1 | 10/2005 | Minamio et al. | |
| 2006/0071351 A1 | 4/2006 | Lange | |
| 2006/0192295 A1 | 8/2006 | Lee et al. | 257/778 |
| 2006/0223229 A1 | 10/2006 | Kirloskar et al. | 438/106 |
| 2006/0223237 A1 | 10/2006 | Combs et al. | 438/122 |
| 2006/0273433 A1 | 12/2006 | Itou et al. | 257/666 |
| 2007/0001278 A1 | 1/2007 | Jeon et al. | 257/676 |
| 2007/0200210 A1 | 8/2007 | Zhao et al. | 257/676 |
| 2007/0235217 A1 | 10/2007 | Workman | 174/260 |
| 2008/0048308 A1 | 2/2008 | Lam | 257/686 |
| 2008/0150094 A1 | 6/2008 | Anderson | 257/659 |

OTHER PUBLICATIONS

Michael Quirk and Julian Serda, Semiconductor Manufacturing Technology, Pearson Education International, Pearson Prentice Hall, 2001, p. 587-588.

Notice of Allowance dated Jun. 17, 2011, U.S. Appl. No. 11/899,189, filed Sep. 4, 2007, Saravuth Sirinorakul et al.

* cited by examiner

PACKAGE WITH HEAT TRANSFER

RELATED APPLICATIONS

This patent application is a continuation in part of U.S. patent application Ser. No. 11/899,189, filed Sep. 4, 2007, and entitled, "PACKAGE WITH HEAT TRANSFER", which claims priority of U.S. Provisional patent application Ser. No. 60/847,434, filed Sep. 26, 2006, and entitled "PACKAGE WITH HEAT TRANSFER", by the same inventors. This application claims benefit of priority under 35 U.S.C. section 119(e) of co-pending U.S. Provisional patent application Ser. No. 61/349,056, filed May 27, 2010, and entitled "PACKAGE WITH HEAT TRANSFER", by the same inventors. This application incorporates U.S. patent application Ser. No. 11/899,189, U.S. provisional application Ser. No. 60/847, 434, and U.S. provisional application Ser. No. 61/349,056 in their entireties by reference.

FIELD OF THE INVENTION

The present invention is in the field of semiconductor packaging and is more specifically directed to semiconductor packaging with heat transfer.

BACKGROUND

Modern semiconductor packages continue to become smaller due to improvements in fabrication technology. These smaller packages are more densely packed with circuitry and components that often run much faster than their predecessors. These improvements typically increase the amount of heat generated within the package, while reducing the amount of exterior surface area available for the dissipation of heat. The factors of small size and high speed circuitry contribute to certain undesirable conditions for the operation of modern packages. For instance, semiconductor performance and reliability are directly related to the operating temperature interior and exterior to the package, and thus performance and reliability are also related to the ability to dissipate heat from the package.

Conventionally, heat reduction is achieved by the inclusion of additional interior and/or exterior heat sinks that undesirably affect the overall form factor of the package. However, as the semiconductor packages decrease in size, as well as the devices that use the circuitry and components within the semiconductor packages, the interior space within the package, or the exterior space for the placement of the package, or both, are often heavily constrained. For example, in small form factor applications, such as mobile technology, the overall form factor of a mobile device is so small that there are both profile or height constraints, as well as board surface area constraints, for the onboard electronics.

SUMMARY OF THE DISCLOSURE

A semiconductor package includes an encapsulant, a semiconductor device within the encapsulant, and one or more terminals for electrically coupling the semiconductor device to a node exterior to the package. The package further includes bonding means coupling the semiconductor device to the one or more terminals. The semiconductor package is configured to dissipate heat through a top surface of the package. To directly dissipate heat via the top surface of the package, in some embodiments a portion of the semiconductor device is exposed at the top surface of the package. In some embodiments, a portion of the one or more of the terminals exposed at a surface of the package.

In some embodiments, instead of having the semiconductor device directly exposed at a surface of the package, a thermal cushion is coupled to the semiconductor device. The thermal cushion can be formed by using a thermally conductive, electrically insulating epoxy, or by using a thermally and electrically conductive epoxy. A molding compound encapsulates the semiconductor device.

In some embodiments, the epoxy is exposed at an exterior of the package, and is preferably of the thermally conductive type. In some packages, the epoxy has a width dimension that approximates the dimensions of a surface of the package. Alternatively, the epoxy has a width dimension that is less than the dimensions of a surface of the packager such as, for instance, the width of the semiconductor device.

Alternatively, or in conjunction with the thermal epoxy, the package of some embodiments includes a cap structure coupled to the semiconductor device. Typically, the cap structure is coupled to the semiconductor device via the thermally conductive epoxy. In some embodiments, the cap structure is formed by using a thermally conductive material, such as a metal, for example. In other embodiments, the cap structure is formed by using a thermally conductive, electrically insulting material, such as a ceramic, for example. The cap structure has a dimension that approximates a dimension of an exterior surface of the package, or alternatively, the cap structure has a dimension that is less than an exterior dimension of the package. Typically, the epoxy forms a layer that is approximately the width of the cap structure, or the epoxy forms a layer that is approximately the width of the semiconductor device.

In some implementations, the cap structure has a dimension that varies from the interior to the exterior of the package. For instance, where the cap structure comprises a step, a smaller portion of the cap structure faces the interior of the package, while a larger portion of the cap structure faces the exterior of the package to aid in heat dispersion. As another example, the cap structure has a tapered shape that broadens toward the exterior surface of the package. In some cases, the cap structure comprises an interlocking feature that is formed by using a step and/or a tapered shape. Preferably, in these cases, the smaller portion of the cap structure is located near the exterior of the package, while the larger portion is located near the interior of the package.

In some embodiments, the epoxy is replaced by a thermally and electrically conductive solder paste, and a copper layer is added between the solder paste and the cap structure. In some embodiments, a second copper layer is added such that the cap structure is sandwiched between the two copper layers. In some embodiments, a heat sink is thermally coupled to second copper layer at the stop surface of the package.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

In a particular embodiment, a package is configured to dissipate heat during operation via at least a bottom side and/or a top side of the package. For packages that dissipate heat from a bottom side, bonding means transfer the heat from a heat generating device, such as a semiconductor device, or die, through metal terminals and/or through exposed semiconductor device attach pads to a printed circuit board (PCB). The bonding means can include, but are not limited to, solder balls, pillar bumps, or binding wires.

Figure 1:
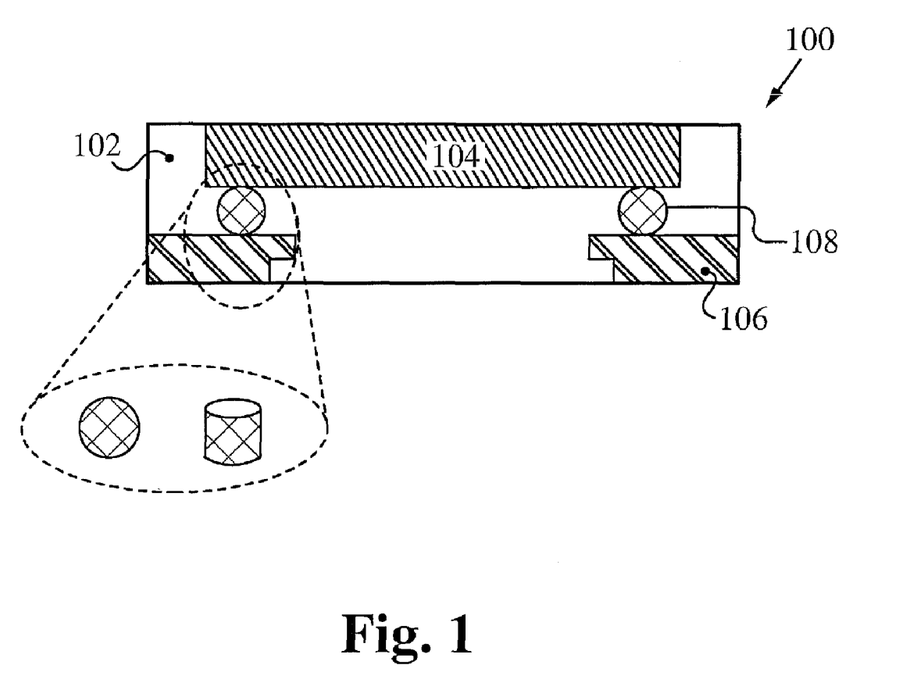
FIG. 1 illustrates a package for heat transfer via an exposed semiconductor device.

For packages that dissipate heat from a top side, at least one side of the semiconductor device is exposed to the outside environment in some embodiments. Hence, in these packages, heat transfer is achieved via the semiconductor device body itself. FIG. 1 illustrates a package for heat transfer via at least one exposed surface of a semiconductor device according to an embodiment. A package 100 includes a molding 102 that encapsulates at least a portion of a semiconductor device 104, such as a die, and one or more terminals 106. A bonding means 108 electrically couples the semiconductor device 104 to one or more of the terminals 106. Preferably, the bonding means 108 is thermally conductive and provides for thermal transfer from the semiconductor device 104 to the terminal 106. The semiconductor device 104 and/or the one or more of the terminals 106 are positioned at or near a surface of the package 100, such that heat from the semiconductor device 104 is advantageously transferred to the exterior of the package 100, via the exposed portion of the semiconductor device 104, or the exposed portions of the one or more terminals 106, or both. As shown in FIG. 1, a surface of the semiconductor device 104 is exposed for heat dissipation via the exposed semiconductor device surface, and a surface of each terminal 106 is exposed for heat dissipation via the exposed terminal surface. In some embodiments, a side surface of the semiconductor device and/or one or more terminals is exposed, which form one or more other heat dissipation surfaces.

In certain instances, it is preferable that the semiconductor device is not directly exposed at the exterior of the package. Hence, alternatively, the semiconductor device is covered by and thermally coupled to another structure to cover the semiconductor device, and the structure is exposed at one or more surfaces of the package. For example, the additional structure can include a thermally conductive layer, which has one side exposed to the outside environment. In some embodiments, the thermally conductive layer is formed using a thermally conductive epoxy. In other embodiments, the thermally conductive layer is formed using a thermally conductive epoxy and a metal cap.

In some embodiments, the thermally conductive epoxy has shock and/or force absorbing properties. In packages that use such a thermally conductive epoxy, the thermally conductive layer not only helps to transfer heat from the semiconductor device to the outside environment, but also serves as a cushion to absorb impact to the semiconductor device. Such impact often occurs during mold cavity clamping step of the molding process.

In some embodiments, heat transfer is advantageously achieved by two routes, a first route via a thermally conductive layer on top, and a second route via a bottom exposed semiconductor device attach pad. In these packages, the exposed semiconductor device attach pad at the bottom of the package encourages efficient heat transfer to the printed circuit board, while the thermally conductive layer has a variety of applications at the top surface of the package. For instance, the top layer of some embodiments advantageously provides for coupling to another structure and/or node external to the top surface of the package.

Alternatively, or in conjunction with a thermally conductive epoxy type material, the thermally conductive layer at the top of the package can be formed by using a thermally conductive cap structure. The material of the cap structure is selected, at least in part, based on its ability to enhance the dissipation of heat. Further, the top exposed thermally conductive layer of various embodiments is formed into a variety of advantageous shapes. For example, the semiconductor devices of some packages are small. Hence, the ability of these small semiconductor devices to transfer heat through a bottom exposed pad is limited. However, for these cases, a thermally conductive layer is preferably added near the top of the package, to advantageously disperse and/or transfer heat toward the top surface of the package. The top thermally conductive layer is preferably formed by using an epoxy and/or a cap structure that is advantageously malleable to meet the particular size and/or shape requirements for the smaller semiconductor devices. Moreover, it is often advantageous that the top exposed thermally conductive layer itself has a small or other particular shape. Further, the various shapes and sizes of the top exposed thermally conductive layer are combined with one or more bottom exposed features, such as a semiconductor device attach pad, for increased and/or maximized thermal transfer. Examples of certain embodiments of the package are further described below, by reference to the figures.

Top Exposed Layer and Thermal Cushion

Figure 1A:
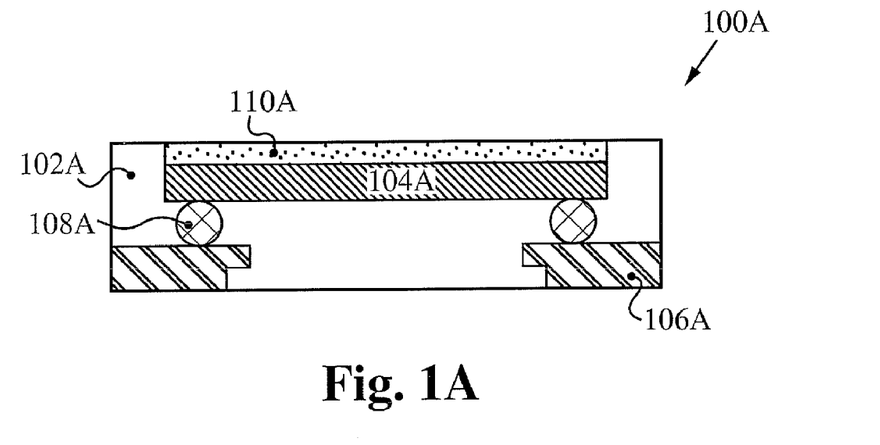
FIG. 1A illustrates a package for heat transfer via a thermal conductive epoxy cushion on top.

Embodiments employing a top exposed layer and/or a thermal cushion are further described in relation to FIG. 1A. More specifically, FIG. 1A illustrates a package 100A for heat transfer via a thermally conductive layer 110A near a top surface of the package. As shown in FIG. 1A, the package 100A includes a molding compound 102A that is typically a plastic or resin type material, that encapsulates a semiconductor device 104A, such as a die.

The semiconductor device 104A is preferably electrically coupled to one or more terminals 106A by using a bonding means 108A. One of ordinary skill recognizes a variety of bonding means including, but not limited to, solder balls, pillar bumps, and/or bonding wires. However, the bonding means is advantageously selected for the ability to transfer heat. In some embodiments, the thermally conductive layer 110A is formed by using a thermally conductive epoxy. In some embodiments, the thermally conductive epoxy is not electrically conductive so as to electrically isolate the semiconductor device 104A. Examples of thermally conductive, electrically insulating epoxies include, but are not limited to, AbleStick 84-3, 2025DS, 8006NS, DF-125, and NEX140. In other embodiments, the thermally conductive epoxy is also electrically conductive. Examples of thermally and electrically conductive epoxies include, but are not limited to, 8600, 2600AT, and 8008HT. In general, thermally conductive, electrically insulating epoxies have a lower thermal conduction rate than thermally and electrically conductive epoxies. However, using epoxies that are both thermally and electrically conductive for the thermally conductive layer 110A sacrifices the electrical safety of the semiconductor device 104A. The thermally conductive layer 110A of these embodiments advantageously receives heat from the semiconductor device 104A and transfers the heat to a location that is external to the package 100A.

Figure 2:
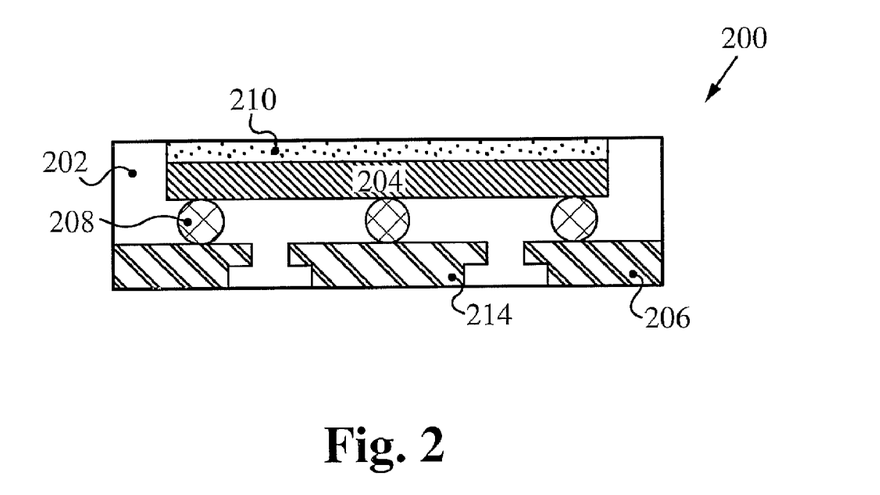
FIG. 2 illustrates a package for heat transfer via a thermal conductive epoxy cushion on top with a bottom exposed pad.

FIG. 2 illustrates a package 200 for heat transfer via a cushion 210 with a bottom exposed semiconductor device attach pad 214. In some embodiments, the cushion 210 is formed by using a thermally conductive epoxy that is coupled to a semiconductor device 204. The cushion 210 advantageously conducts heat from within the package 200 to an external location. The cushion 210 is configured and functions similarly to the thermally conductive layer 110A of FIG. 1A. Since in these embodiments, the cushion 210 is located near a top surface of the package 200, heat is advantageously transferred from the semiconductor device 204 via the cushion 210, without affecting the electrical and/or thermal contacts at the bottom surface of the package 200. Moreover, space is typically in short supply at a bottom surface of these packages 200, as illustrated by the inclusion of the pad 214 and contact leads and/or terminals 206 in FIG. 2.

Cap Structure

Figure 3:
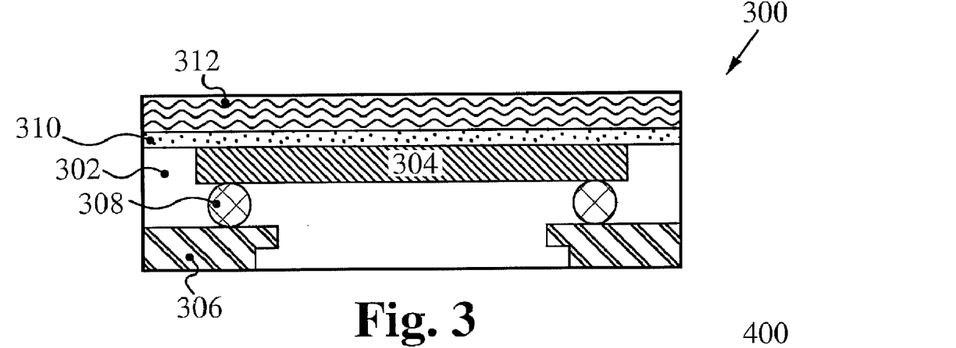
FIG. 3 illustrates a package for heat transfer via a cap structure on top.

FIG. 3 illustrates a package 300 for heat transfer via a cap structure 312. As shown in FIG. 3, the cap structure 312 is exposed at a surface of the package 300, and is coupled within the interior of the package 300 to a semiconductor device 304 by using a layer of thermally conductive epoxy 310. In the implementation 300 of FIG. 3, the layer of thermally conductive epoxy 310 and the cap structure 312 spans the width of the package 300.

In some embodiments, the cap structure 312 is made of a metal material, which is both thermally and electrically conductive. To provide electrical isolation for the semiconductor device 304 when the cap structure 312 is a metal cap, the thermally conductive epoxy 310 is electrically insulating. Epoxies that are thermally conductive, but electrically insulating typically have a thermal conductivity of less than 1 W/mK. A thermally conductive, electrically insulating epoxy has a lower thermal conductivity than a thermally and electrically conductive epoxy, which typically has a thermal conductivity of more than 2.5 W/mK.

To improve the heat dissipation property of the package 300 while maintaining the electrical safety of the semiconductor device 304, in some embodiments the thermally conductive epoxy 310 is made using a thermally and electrically conductive epoxy, and the cap structure 312 is made using a thermally conductive, electrically insulating material. In some embodiments, the thermally conductive, electrically insulating cap structure material is a ceramic. Examples of ceramic used as a thermally conductive, electrically isolating material include, but are not limited to, aluminum oxide, which has a thermal conductivity of about 24 W/mK, and aluminum nitride, which has a thermal conductivity of about 180 W/mK.

Figure 4:
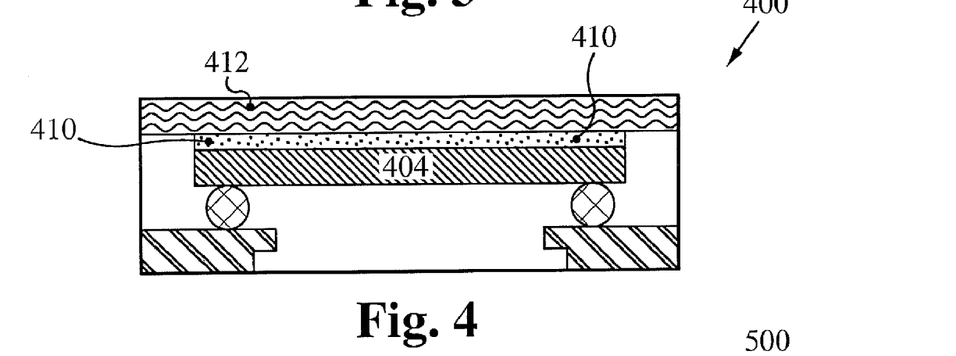
FIG. 4 illustrates an alternative implementation of the package of FIG. 3.

FIG. 4 illustrates an alternative implementation 400 of the package 300 of FIG. 3. In the implementation 400 of FIG. 4, the layer of thermally and electrically conductive epoxy 410 spans the width of the semiconductor device 404, and the thermally conductive, electrically insulating cap structure 412 spans the width of the package 400.

Figure 5:
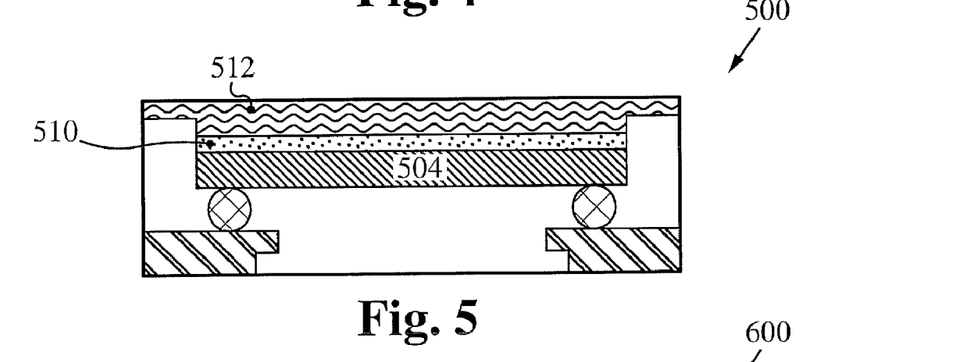
FIG. 5 illustrates an alternative implementation of the package of FIG. 4.

FIG. 5 illustrates an alternative implementation 500 of the package 400 of FIG. 4. In the implementation 500 of FIG. 5, the thermally conductive, electrically insulating cap structure 512 has a variety of widths for different portions of the cap structure 512. For instance, in FIG. 5 the cap structure 512 has the width of the package 500 at the external, exposed surface, while the cap structure 512 has the width of the semiconductor device 504 at least at an internal surface of the cap structure 512 that is coupled to the semiconductor device 504, via the thermally and electrically conductive epoxy 510, within the interior of the package 500. The configuration 500 maximizes the surface area coupling the cap structure 512 and the semiconductor die, and also maximizes the surface area of the cap structure 512 exposed at the top surface of the package 500. As shown in FIG. 5, the cap structure has a step configuration where transitioning from the width of the exposed top surface to the width of the semiconductor device. It is understood that alternative transition configurations can be used.

Figure 6:
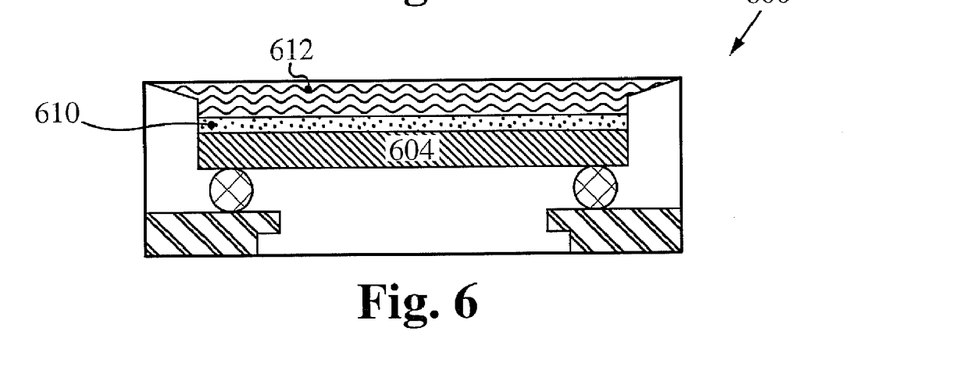
FIG. 6 illustrates an alternative implementation of the package of FIG. 5.

FIG. 6 illustrates an alternative implementation of the package 500 of FIG. 5. A thermally conductive, electrically insulating cap structure 612 is coupled to a semiconductor device 604 via a thermally and electrically conductive epoxy 610. As shown in FIG. 6, the shape of the thermally conductive, electrically insulating cap structure 612 includes a variety of features, such as a gradual tapering configuration from the width of the semiconductor device 604 internal to the package 600 to the width at the external, exposed surface of the package 600. Such a configuration further includes particular advantages in the use of space within the package 600, while promoting efficient heat transfer to the exterior of the package 600.

Cap Structure for Small Die

Figure 7:
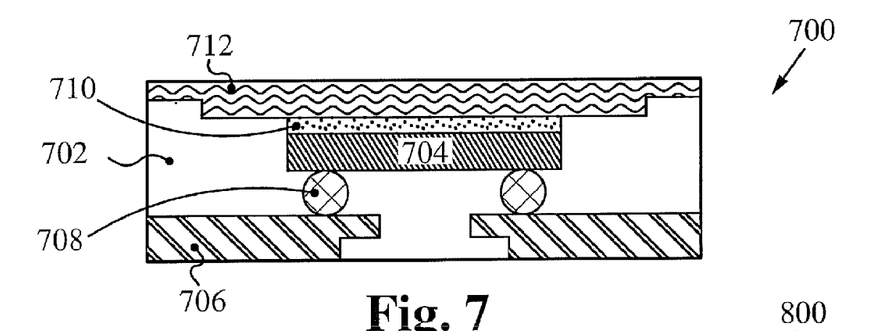
FIG. 7 illustrates a small die version of package for heat transfer via a cap structure on top.

FIGS. 7 through 10 illustrate embodiments of the package that are suitable for small semiconductor devices. For instance, FIG. 7 illustrates a thermally conductive, electrically insulating cap structure 712 coupled to a small semiconductor device 704 by using a thermally and electrically conductive epoxy 710. The semiconductor device 704 is smaller than the semiconductor devices 104-604 in FIGS. 1-6. The cap structure 712 is similarly configured as the cap structure 512 in FIG. 5. The epoxy 710 spans the width of the semiconductor device 704. The epoxy 710 and the cap structure 712 advantageously conduct heat from the semiconductor device 704 and transfer the heat to a location exterior to the package 700.

Figure 8:
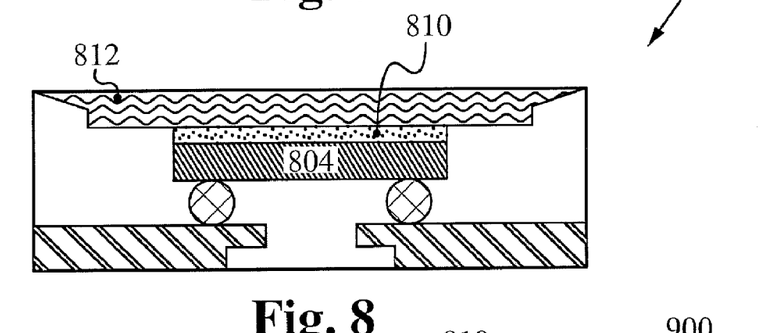
FIG. 8 illustrates an alternative implementation of the package of FIG. 7.

FIG. 8 illustrates an alternative implementation 800 of the package 700 of FIG. 7. A thermally conductive, electrically insulating cap structure 812 is coupled to a semiconductor device 804 via a thermally and electrically conductive epoxy 810. In the implementation 800 of FIG. 8, the cap structure 812 has a tapered shape similar in configuration to the cap structure 612 in FIG. 6. The epoxy 810 spans the width of the semiconductor device 804.

In FIGS. 7 and 8, the layers of epoxy 710 and 810, respectively, extend and/or are applied first to the dimensions of the semiconductor devices 704 and 804, respectively. Alternatively, in FIGS. 9 and 10, thermally and electrically conductive epoxy layers 910 and 1010 extend and/or are applied first to the dimensions of thermally conductive, electrically insulating cap structures 912 and 1012, respectively.

Figure 9:
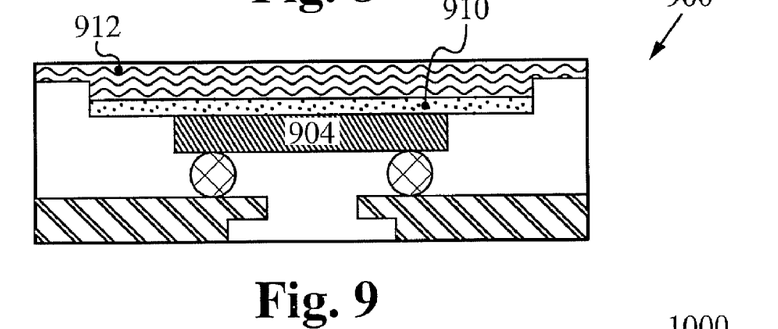
FIG. 9 illustrates an alternative implementation of the package of FIG. 7.
Figure 10:
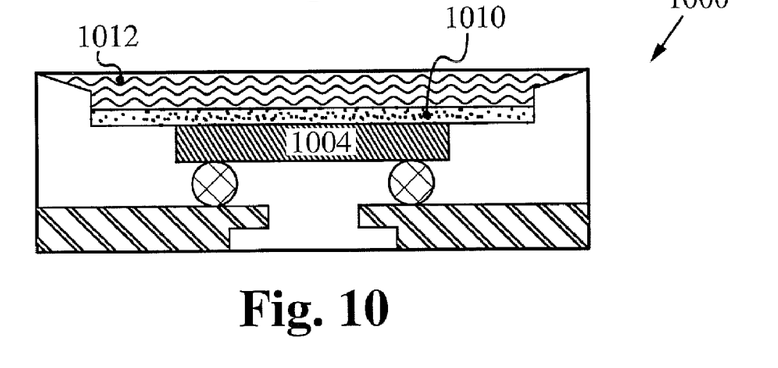
FIG. 10 illustrates an alternative implementation of the package of FIG. 9.

More specifically, FIG. 9 illustrates a thermally and electrically conductive epoxy layer 910 that has an alternative shape or dimension than the epoxy 710 of the package 700 of FIG. 7. Similarly, FIG. 10 illustrates a thermally and electrically conductive epoxy layer 1010 that has an alternative dimension than the epoxy 810 of the package 800 of FIG. 8. Hence, as further shown in these figures, the interface between the semiconductor device, the thermally conductive layer, and the exterior of the package has a variety of dimensions to meet the needs of a variety of package specifications and/or applications. The packages described above, are also selectively used in conjunction with additional mechanisms for heat transfer, for example, at a bottom surface of the package.

Exposed Pad

Figure 11:
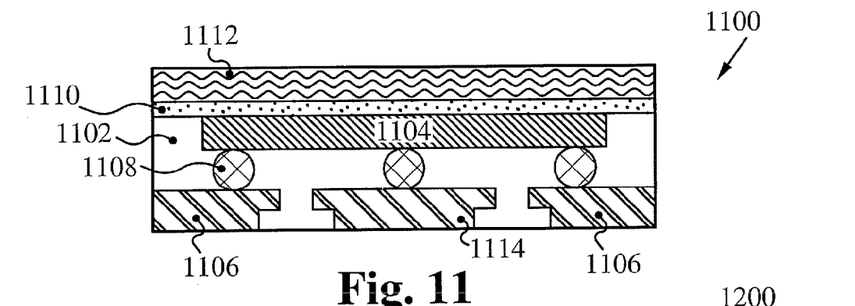
FIG. 11 illustrates a package for heat transfer via a cap structure on top with a bottom exposed pad.

FIG. 11 illustrates a package 1100 for heat transfer via a thermally conductive layer and a bottom exposed pad 1114. The thermally conductive layer includes a thermally conductive, electrically insulating cap structure 1112 and a thermally and electrically conductive epoxy 1110. As described above, the cap structure 1112 is preferably located near a top portion of the package 1100. A semiconductor device 1104 is coupled to the cap structure 1112 via the epoxy 1110. The cap structure 1112 and the epoxy 1110 are similarly configured as the cap structure 312 and the epoxy 310 in FIG. 3. The semiconductor device 1104 is electrically and thermally coupled to the pad 1114 and/or one or more terminals 1106 via bonding means 1108. Preferably, the pad 1114 and the one or more terminals 1106 are exposed at a surface of the package 1100. One of ordinary skill recognizes a variety of bonding means including, but not limited to, solder balls, pillar bumps, and/or bonding wires.

Figure 12:
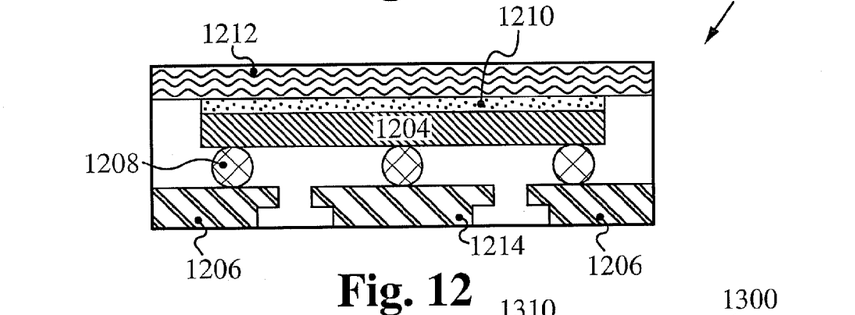
FIG. 12 illustrates an alternative implementation of the package of FIG. 11.

FIG. 12 illustrates an alternative implementation 1200 of the package 1100 of FIG. 11. A thermally conductive, electrically insulating cap structure 1212 is coupled to a semiconductor device 1204 via a thermally and electrically conductive epoxy 1210. The semiconductor device 1204 is electrically and thermally coupled to a pad 1214 and/or one or more terminals 1206 via bonding means 1208. The cap structure 1212 and the epoxy 1210 are similarly configured as the cap structure 412 and the epoxy 410 in FIG. 4. In the implementation 1200 of FIG. 12, the epoxy 1210 has the width of the semiconductor device 1204.

Figure 13:
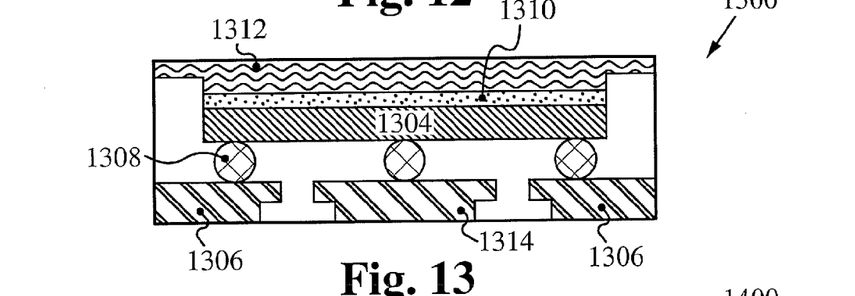
FIG. 13 illustrates an alternative implementation of the package of FIG. 12.

FIG. 13 illustrates an alternative implementation 1300 of the package 1200 of FIG. 12. A thermally conductive, electrically insulating cap structure 1312 is coupled to a semiconductor device 1304 via a thermally and electrically conductive epoxy 1310. The semiconductor device 1304 is electrically and thermally coupled to a pad 1314 and/or one or more terminals 1306 via bonding means 1308. The cap structure 1312 and the epoxy 1310 are similarly configured as the cap structure 512 and the epoxy 510 in FIG. 5. In the implementation 1300 of FIG. 13, the cap structure 1312 has a wider width at an exterior of the package 1300 than at the epoxy 1310, where the cap structure 1312 preferably has the width of the semiconductor device 1304. As shown in FIG. 13, the cap structure has a step configuration where transitioning from the width of the exposed top surface to the width of the semiconductor device. It is understood that alternative transition configurations can be used.

Figure 14:
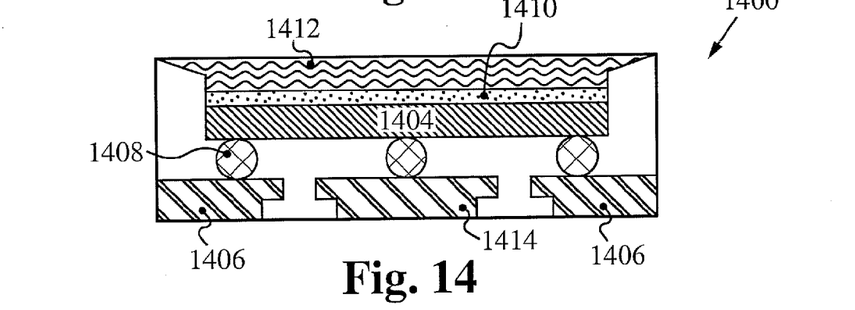
FIG. 14 illustrates an alternative implementation of the package of FIG. 13.

FIG. 14 illustrates an alternative implementation 1400 of the package 1300 of FIG. 13. A thermally conductive, electrically insulating cap structure 1412 is coupled to a semiconductor device 1404 via a thermally and electrically conductive epoxy 1410. The semiconductor device 1404 is electrically and thermally coupled to a pad 1414 and/or one or more terminals 1406 via bonding means 1408. The cap structure 1412 and the epoxy 1410 are similarly configured as the cap structure 612 and the epoxy 610 in FIG. 6. The implementation 1400 of FIG. 14 includes the cap structure 1412 that has a tapered shape. Thus, the cap structure of different embodiments has a variety of shapes, which provide space savings and/or promote efficient heat transfer for example. Moreover, the packages 1100, 1200, 1300, and 1400, include both a thermally conductive layer near the top of the package, and thermally conductive bottom exposed terminals and die pad, for improved heat transfer via a plurality of routes.

Small Cap Structure

Figure 15:
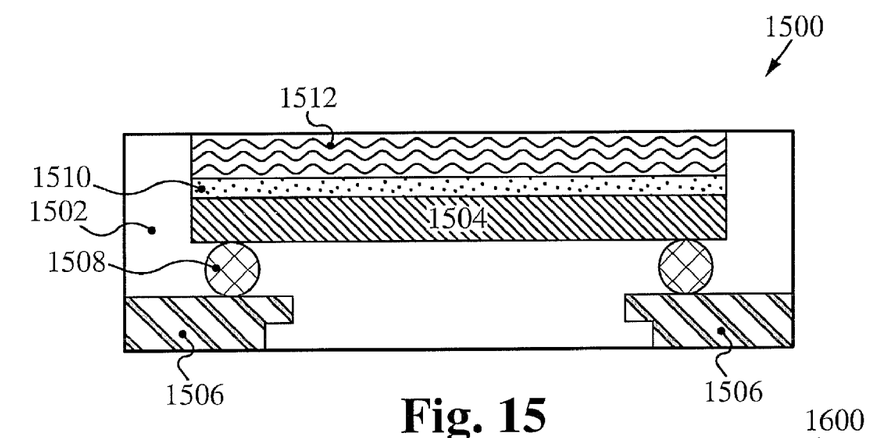
FIG. 15 illustrates a package for heat transfer via a small cap structure on top.

FIG. 15 illustrates a package 1500 for heat transfer via a thermally conductive, electrically insulating small cap structure 1512 that is exposed at a top surface of the package 1500. The cap structure 1512 has a width that is approximately the width of a semiconductor device 1504 to which it is coupled by using a thermally and electrically conductive epoxy 1510. In this implementation, the dimensions of the cap structure 1512 are less than the dimensions of the surface of the package 1500 at which the cap structure 1512 is exposed. For instance, the cap structure 1512 of some embodiments has dimensions 0.7 by 0.7 millimeters, while the package 1500 of these embodiments has dimensions of about 1 by 1 millimeters.

Figure 16:
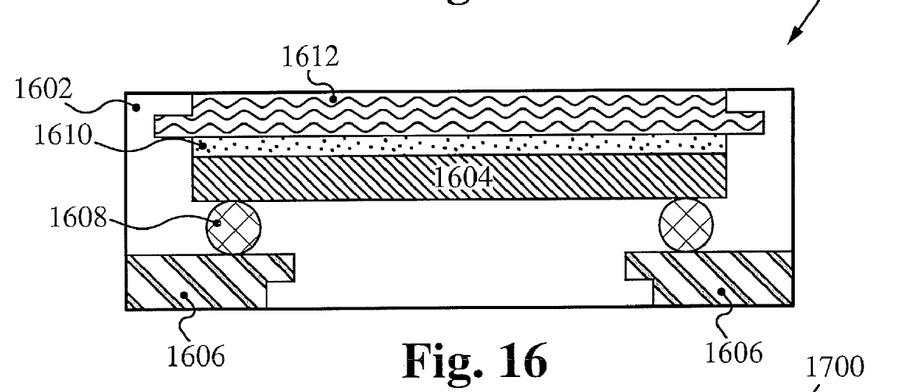
FIG. 16 illustrates an alternative implementation of the package of FIG. 15.

FIG. 16 illustrates an alternative implementation 1600 of the package 1500 of FIG. 15. A thermally conductive, electrically insulating cap structure 1612 is coupled to a semiconductor device 1604 via a thermally and electrically conductive epoxy 1610. As shown in FIG. 16, the package 1600 includes a cap structure 1612 that has an interlocking feature, such as a step, at one or more edges of the cap structure 1612. The interlocking feature is preferably embedded within the encapsulant 1602 of the package 1600 to advantageously minimize separation of the cap structure 1612 from the package 1600.

Figure 17:
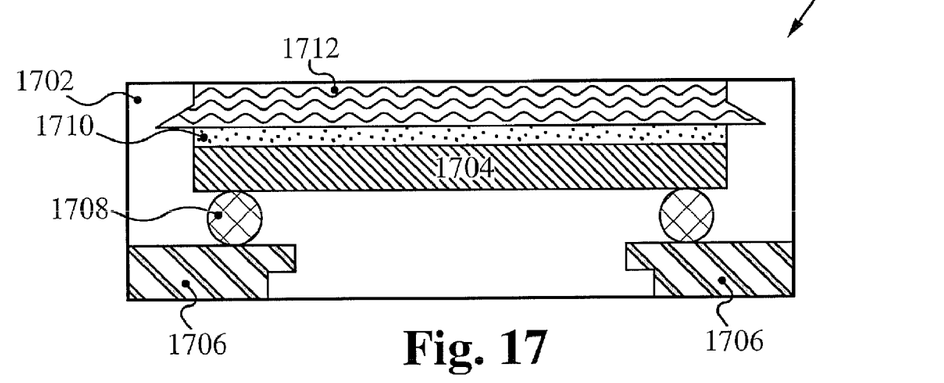
FIG. 17 illustrates an alternative implementation of the package of FIG. 16.

FIG. 17 illustrates an alternative implementation 1700 of the package 1600 of FIG. 16. A thermally conductive, electrically insulating cap structure 1712 is coupled to a semiconductor device 1704 via a thermally and electrically conductive epoxy 1710. As shown in FIG. 17, the cap structure 1712 of different embodiments has an interlocking feature that employs a variety of shapes to achieve improved resistance to separation from the package 1700.

Small Cap Structure and Exposed Die Pad

Figure 18:
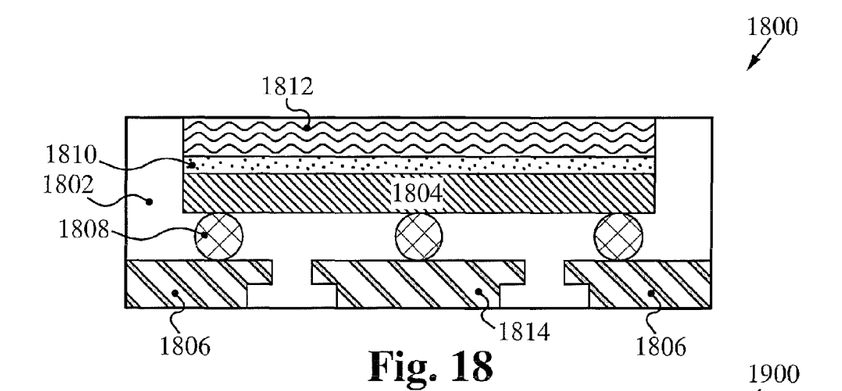
FIG. 18 illustrates a package for heat transfer via a small cap structure on top with a bottom exposed pad.

FIG. 18 illustrates a package 1800 for heat transfer via a thermally conductive layer on top with a bottom exposed die pad 1814. The thermally conductive layer includes a thermally conductive, electrically insulating cap structure 1812 and a thermally and electrically conductive epoxy 1810. As shown in FIG. 18, the molding compound 1802 encapsulates a semiconductor device 1804 that is coupled on one surface to one or more terminals 1806 and to a die pad 1807. Preferably, one or more terminals 1806 and the die pad 1807 are exposed at a surface of the package 1800. The cap structure 1812 and the epoxy 1810 are similarly configured as the cap structure 1512 and the epoxy 1510 in FIG. 15. The semiconductor device 1804 is electrically and thermally coupled to the pad 1814 and/or one or more terminals 1806 via bonding means 1108. One of ordinary skill recognizes a variety of bonding means including, but not limited to, solder balls, pillar bumps, and/or bonding wires.

Figure 19:
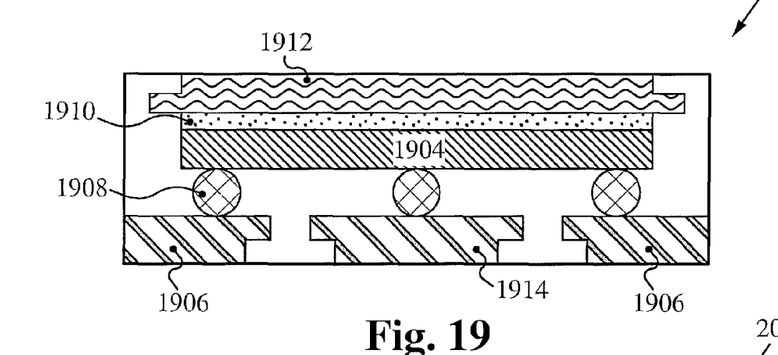
FIG. 19 illustrates an alternative implementation of the package of FIG. 18.

FIG. 19 illustrates an alternative implementation 1900 of the package 1800 of FIG. 18. A thermally conductive, electrically insulating cap structure 1912 is coupled to a semiconductor device 1904 via a thermally and electrically conductive epoxy 1910. The cap structure 1912 and the epoxy 1910 are similarly configured as the cap structure 1612 and the epoxy 1610 in FIG. 16. As shown in FIG. 19, the cap structure 1912 includes an interlocking feature embedded within the package 1900 to advantageously resist separation from the package 1900.

Figure 20:
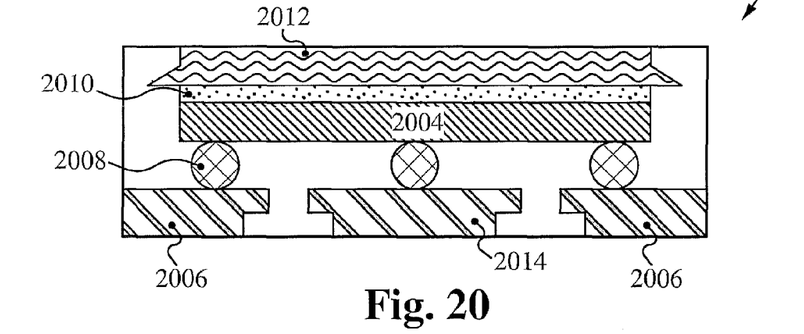
FIG. 20 illustrates an alternative implementation of the package of FIG. 19.

FIG. 20 illustrates an alternative implementation 2000 of the package 1900 of FIG. 19. A thermally conductive, electrically insulating cap structure 2012 is coupled to a semiconductor device 2004 via a thermally and electrically conductive epoxy 2010. The cap structure 2012 and the epoxy 2010 are similarly configured as the cap structure 1712 and the epoxy 1710 in FIG. 17. As shown in FIG. 20, the interlocking feature of different embodiments has a variety of shapes that serve to prevent separation from the package 2000.

Thermal Cushion and Copper Layer

Figure 21:
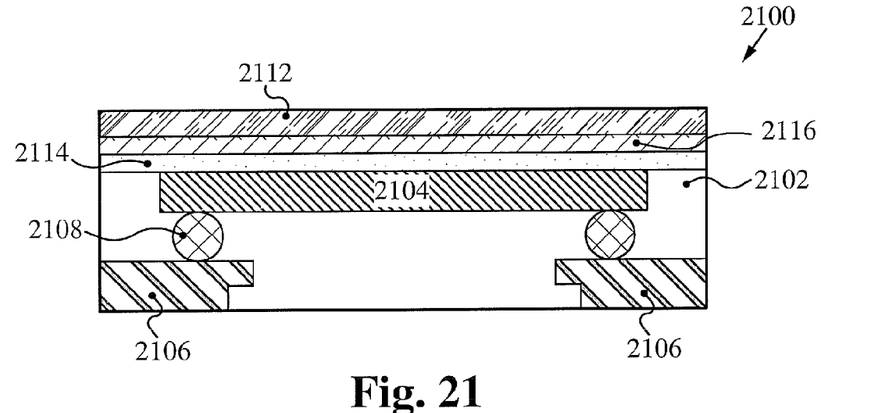
FIG. 21 illustrates a package for heat transfer via a copper layer and a cap structure.

In some embodiments, the thermally and electrically conductive epoxy is replaced by a solder paste, and a copper layer is added between the solder paste and the cap structure. Both the solder paste and the copper layer are thermally and electrically conductive. FIG. 21 illustrates a package 2100 for heat transfer via a thermally conductive layer. The thermally conductive layer includes a thermally conductive, electrically insulating cap structure 2112, a thermally and electrically conductive solder paste 2114, and a thermally and electrically conductive copper layer 2116. As shown in FIG. 21, the molding compound 2102 encapsulates a semiconductor device 2104 that is coupled on one surface to one or more terminals 2106. Preferably, one or more terminals 2106 are exposed at a surface of the package 2100. The semiconductor device 2104 is electrically and thermally coupled to the one or more terminals 2106 via bonding means 2108. One of ordinary skill recognizes a variety of bonding means including, but not limited to, solder balls, pillar bumps, and/or bonding wires.

In an exemplary implementation, an SAC 305 solder paste having a thermal conductivity of about 58.7 W/mK is used. Copper has a thermal conductivity of about 400 W/mK. The use of the solder paste and the copper layer provides improved heat dissipation over the use of thermally and electrically conductive epoxy.

As shown in FIG. 21, the cap structure 2112, the copper layer 2116, and the solder paste 2114 are similarly configured as the cap structure 312 and the epoxy 310 in FIG. 3. Alternative configurations are also contemplated. For example, the cap structure can be configured similarly to any of the cap structures shown in FIGS. 3-20, and the copper layer and the solder paste can be configured similarly to any of the epoxy configurations shown in FIGS. 3-20. Alternatively, the cap structure and copper layer can be configured similarly to any of the cap structures shown in FIGS. 3-20, and the solder paste can be configured similarly to any of the epoxy configurations shown in FIGS. 3-20.

Figure 22:
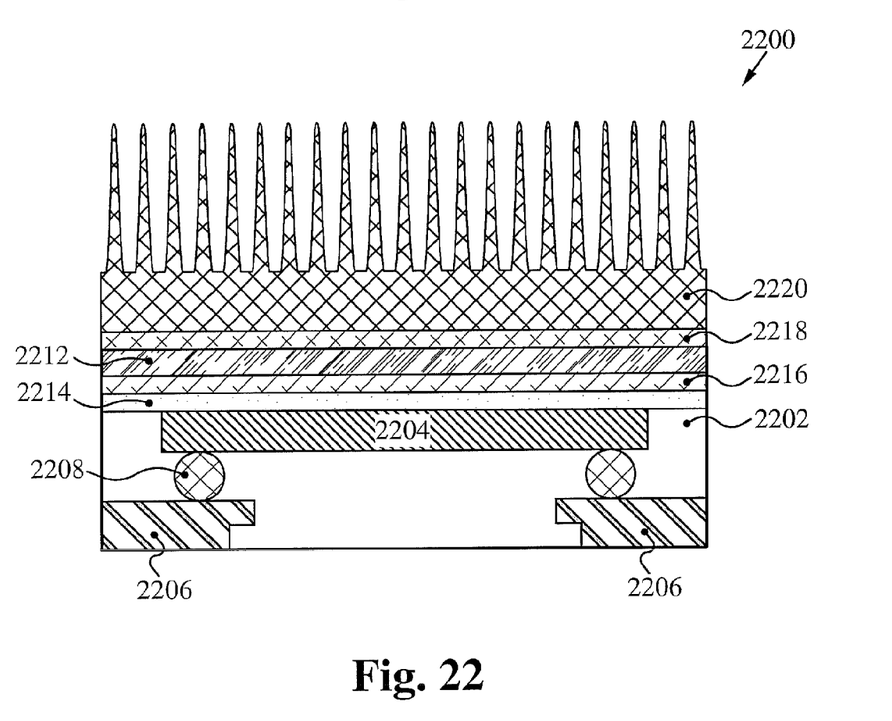
FIG. 22 illustrates a package for heat transfer via multiple copper layers, a cap structure, and a heat sink.

In some embodiments, additional heat dissipating components can be added. FIG. 22 illustrates an alternative implementation 2200 of the package 2100 of FIG. 21. A thermally conductive layer including a thermally conductive, electrically insulating cap structure 2212, a thermally and electrically conductive solder paste 2214, and a thermally and electrically conductive first copper layer 2216 is similarly configured as the thermally conductive layer including the thermally conductive, electrically insulating cap structure 2112, the thermally and electrically conductive solder paste 2114, and the thermally and electrically conductive copper layer 2116 of FIG. 21. Additionally, a thermally and electrically conductive second copper layer 2218 is coupled to the cap structure 2212 such that the cap structure 2212 is sandwiched between the first copper layer 2216 and the second copper layer 2218. A heat sink 2220 is coupled to the top of the package 2200 such that the heat sink 2220 is thermally coupled to the second copper layer 2218. In some embodiments, the heat sink 2220 is coupled to the second copper layer 2218 using a thermally conductive adhesive or solder.

As shown in FIG. 22, the cap structure 2112, the first copper layer 2116, the second copper layer 2118, and the solder paste 2114 are similarly configured as the cap structure 312 and the epoxy 310 in FIG. 3. Alternative configurations are also contemplated. For example, the cap structure and the second copper layer can be configured similarly to any of the cap structures shown in FIGS. 3-20, and the first copper layer and the solder paste can be configured similarly to any of the epoxy configurations shown in FIGS. 3-20. Alternatively, the cap structure, the first copper layer, and the second copper layer can be configured similarly to any of the cap structures shown in FIGS. 3-20, and the solder paste can be configured similarly to any of the epoxy configurations shown in FIGS. 3-20.

Method

Figure 23:
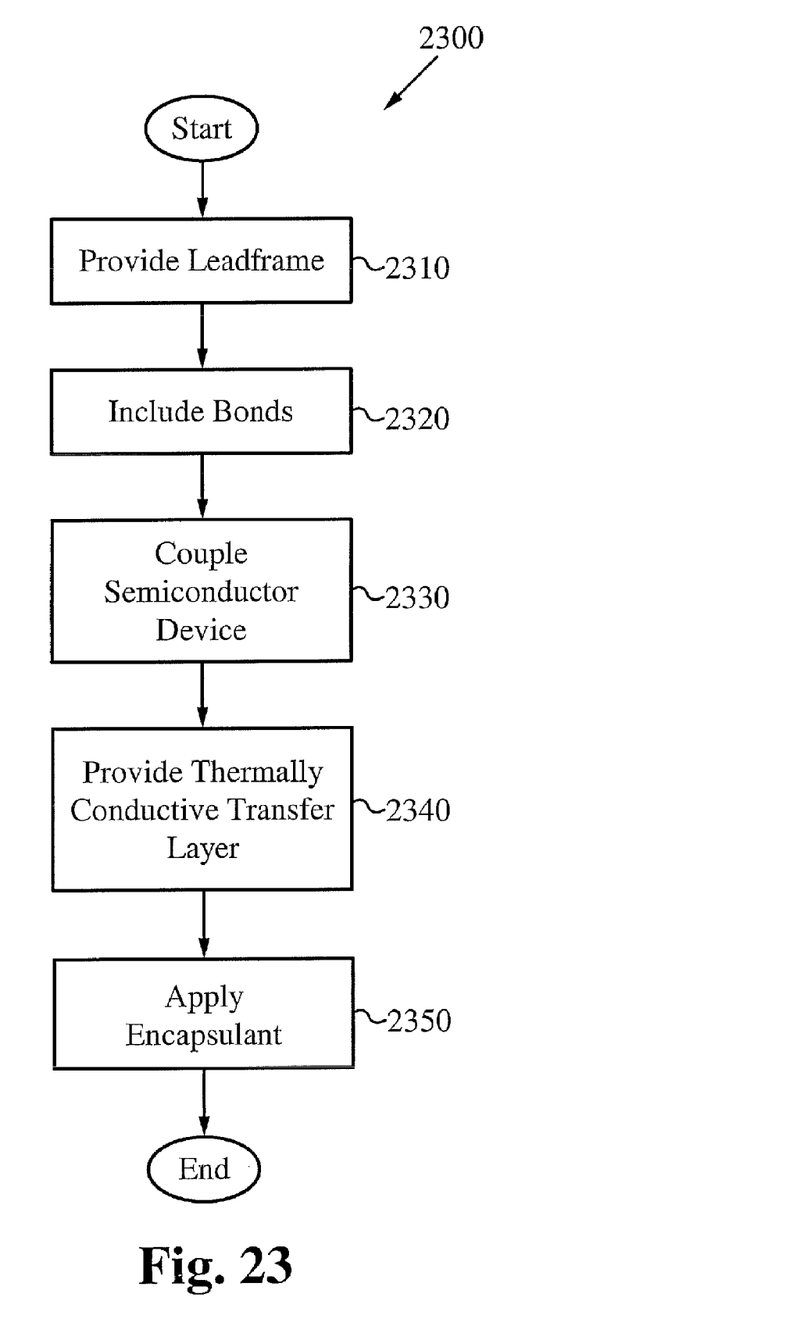
FIG. 23 illustrates a process for forming a package of some embodiments.

FIG. 23 is a flow illustrating a process 2300 for forming the package of some embodiments. As shown in this figure, the process 2300 begins at the step 2310, where a leadframe is provided. In some embodiments, a leadframe is formed by etching and/or stamping a metal layer. The leadframe optionally includes one or more contact terminals and/or one or more die attach pads. Once the leadframe is provided at the step 2310, the process 2300 transitions to the step 2320, where a bonding means is coupled to the leadframe and/or to a semiconductor device. For instance, in some embodiments, solder balls are placed on a top surface of the leadframe and/or on a surface of the semiconductor device. In some embodiments, coupling is achieved by screen printing the leadframe with solder on its surface at a location of solder balls or pillar bumps. The solder balls or pillar bumps are attached to the circuit surface. Then, the process 2300 transitions to the step 2330, where the semiconductor device is attached and/or bonded to the leadframe, including the contact terminals and/or attach pads of the leadframe. As mentioned above, the bonding is performed by using conventional bonding means including, but not limited to, solder, solder balls, and/or pillar bumps. In some embodiments, bonding is effectuated by a standard semiconductor assembly reflow process. After the semiconductor device is bonded to the leadframe, the process 2300 transitions to the step 2340, where a thermally conductive layer is formed. In a particular implementation, the thermally conductive layer includes a thermally and electrically conductive cushion. The cushion of some embodiments is formed by applying a layer of thermally conductive adhesive and/or epoxy to a surface of the semiconductor device.

Alternatively, some embodiments include an additional thermally conductive, electrically insulating cap structure. The epoxy is optionally applied to a surface of the cap structure. The cap structure is then coupled to the semiconductor device by via the layer of epoxy. In some embodiments, the cap structure comprises a material that has particular heat transference and electrical insulating properties, such as a ceramic, for example.

Still alternatively, in some embodiments, the thermally and electrically conductive epoxy is replaced by solder paste. In addition, a copper layer is applied to the solder paste, and the cap structure is applied to the copper layer. A high temperature eutectic melting process is formed to join the copper layer to the cap structure. In some embodiments, the cap structure forms the top surface, or a portion thereof, of the package. In other embodiments, a second copper layer is applied to the top surface of the cap structure such that the cap structure is sandwiched between the two copper layers. The two copper layers are applied prior to the high temperature eutectic melting process. After the high temperature eutectic melting process, a heat sink is applied to the top of the package such that the heat sink is thermally coupled to the second copper layer. In some embodiments, the heat sink is coupled to the second copper layer using a thermally conductive adhesive or solder.

After the thermally conductive layer is formed at the step 2340, the process 2300 transitions to the step 2350, where a molding compound is used to encapsulate the package. Preferably, the encapsulation at the step 2350 leaves a bottom surface of the contact terminal(s) and/or attach pad(s) exposed at the exterior of the package. Further preferably, the encapsulation leaves a top surface of the thermally conductive layer, such as the thermally conductive cushion, the cap structure, the electrical insulating material, or the copper layer, exposed at an exterior of the package. The step 2350 of some embodiments alternatively includes additional steps such as singulation, etching, and/or stamping or other means to leave the selected thermally and/or electrically conductive elements of the package exposed at the exterior surfaces.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A package for a semiconductor device, the package comprising:
    the semiconductor device having an active surface and a passive surface;
    one or more terminals coupled to the semiconductor device, a portion of the one or more terminals exposed at a mounting surface of the package;
    a thermal cushion coupled to the passive surface semiconductor device, wherein the thermal cushion comprises a thermally and electrically conductive material or the thermal cushion comprises a thermally conductive and electrically insulating material, and the package further comprises a metallic layer thermally coupled between the thermal cushion and the cap structure;
    a cap structure thermally coupled to the thermal cushion, the cap structure comprising a thermally conductive and electrically insulating material;
    a second metallic layer thermally coupled to the cap structure such that the cap structure is positioned between the first metallic layer and the second metallic layer; and
    a molding compound encapsulating at least a portion of the semiconductor device.

2. The package of claim 1, wherein the thermal cushion comprises thermally and electrically conductive epoxy.

3. The package of claim 1, wherein the thermal cushion comprises thermally conductive and electrically insulating epoxy.

4. The package of claim 1, wherein the thermal cushion has a width dimension that is less than a width of a surface of the package.

5. The package of claim 1, wherein the one or more terminals are coupled to the semiconductor device via a bonding means.

6. The package of claim 1, wherein the cap structure comprises ceramic.

7. The package of claim 1, wherein the cap has a dimension that is less than a width of an exterior surface of the package.

8. The package of claim 7, wherein the thermal cushion forms a layer having a dimension that is approximately a width of the cap structure.

9. The package of claim 7, wherein the thermal cushion forms a layer having a dimension that is approximately a width of the semiconductor device.

10. The package of claim 1, wherein the cap structure had a dimension that varies from the interior to the exterior of the package.

11. The package of claim 10, wherein the cap structure has a tapered shape.

12. The package of claim 10, wherein the cap structure has an interlocking feature.

13. The package of claim 12, wherein the interlocking feature comprises a tapered shape.

14. The package of claim 1, wherein the one or more terminals are coupled to the semiconductor device via a solder ball.

15. The package of claim 1, wherein the one or more terminals are coupled to the semiconductor device via a solder cylinder.

16. The package of claim 1, wherein the active surface is oriented toward the one or more terminals.

17. The package of claim 1, wherein the thermal cushion has a width dimension that is the same as a width dimension of the package.

18. The package of claim 1, wherein the metallic layer has a width dimension that is the same as a width dimension of the package.

19. The package of claim 1, wherein the second metallic layer has a width dimension that is the same as a width dimension of the package.

20. The package of claim 1, further comprising a heat sink thermally coupled to the second metallic layer.

21. The package of claim 20, wherein the heat sink has a width dimension that is the same as a width dimension of the package.

* * * * *